United States Patent
Köhler et al.

(10) Patent No.: US 8,717,540 B2
(45) Date of Patent: May 6, 2014

(54) CALCULATING A LASER METRIC WITHIN A LITHOGRAPHIC APPARATUS AND METHOD THEREOF

(75) Inventors: Carsten Andreas Köhler, Veldhoven (NL); Hans Van Der Laan, Veldhoven (NL); Frank Staals, Eindhoven (NL); Laurentius Cornelius De Winter, Vessem (NL); Herman Philip Godfried, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 536 days.

(21) Appl. No.: 13/019,365

(22) Filed: Feb. 2, 2011

(65) Prior Publication Data

US 2011/0200922 A1    Aug. 18, 2011

Related U.S. Application Data

(60) Provisional application No. 61/304,088, filed on Feb. 12, 2010.

(51) Int. Cl.
*G03B 27/54*    (2006.01)
*G03B 27/32*    (2006.01)

(52) U.S. Cl.
USPC .............................................. 355/67; 355/77

(58) Field of Classification Search
CPC .................................................. G03F 7/70575
See application file for complete search history.

(56) References Cited

U.S. PATENT DOCUMENTS

| | | | |
|---|---|---|---|
| 6,242,137 B1 * | 6/2001 | Yeh | 430/5 |
| 6,700,916 B1 | 3/2004 | Kramer et al. | |
| 7,079,556 B2 * | 7/2006 | Fomenkov et al. | 372/9 |
| 7,456,934 B2 | 11/2008 | Asaishi | |
| 7,701,555 B2 | 4/2010 | Arai | |
| 2007/0195836 A1 | 8/2007 | Dunstan et al. | |
| 2007/0273852 A1 | 11/2007 | Arai | |
| 2008/0285602 A1 | 11/2008 | Nagai et al. | |

FOREIGN PATENT DOCUMENTS

| | | |
|---|---|---|
| CN | 101080807 A | 11/2007 |
| JP | 2001-267673 A | 9/2001 |
| JP | 2005-501399 A | 1/2005 |
| JP | 2008-140956 A | 6/2008 |
| TW | 200827940 A | 7/2008 |
| WO | WO 2007/004567 A1 | 1/2007 |

OTHER PUBLICATIONS

Dunstan, W.J., et al., "Active Spectral Control of DUV light sources for OPE minimization," *Proceedings of SPIE* vol. 6154:J1-J9, Optical Microlithography XIX, edited by Donis G. Flagello (2006).

* cited by examiner

*Primary Examiner* — Peter B Kim
*Assistant Examiner* — Michelle Iacoletti
(74) *Attorney, Agent, or Firm* — Sterne, Kessler, Goldstein & Fox P.L.L.C

(57) ABSTRACT

Embodiments of the invention related to lithographic apparatus and methods. A lithographic method comprises calculating a laser metric based on a spectrum of laser radiation emitted from a laser to a lithographic apparatus together with a representation of an aerial image of a pattern to be projected onto the substrate by the lithographic apparatus, and using the laser metric to modify operation of the laser or adjust the lithographic apparatus, and projecting the pattern onto the substrate.

19 Claims, 3 Drawing Sheets

CALCULATING A LASER METRIC WITHIN A LITHOGRAPHIC APPARATUS AND METHOD THEREOF

CROSS REFERENCE TO RELATED APPLICATIONS

This application claims benefit under 35 U.S.C. 119(e) to U.S. Provisional Patent Application No. 61/304,088, filed Feb. 12, 2010, which is incorporated by reference herein in its entirety.

BACKGROUND OF THE INVENTION

1. Field of Invention

The invention relates to a lithographic apparatus and a device manufacturing method.

2. Related Art

A lithographic apparatus applies a desired pattern onto a target portion of a substrate. Lithographic apparatus are used, for example, in the manufacture of integrated circuits (ICs). When so used, a patterning device, such as a mask or a reticle, may be used to generate a circuit pattern to be formed on an individual layer of the IC. This pattern can be imaged onto a target portion (e.g. corresponding to a portion of one or more dies) of a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in a single operation, and so-called scanners, in which each target portion is irradiated by scanning the pattern using a beam moving in a given "scanning"-direction with respect to the substrate while synchronously scanning the substrate parallel or anti parallel to this direction.

Lithographic apparatus include a source configured to generate radiation which is used to illuminate the patterning device, and thereby allow a pattern present on the patterning device to be projected onto the substrate. The source may for example be a laser which is configured to emit ultraviolet radiation (e.g. radiation having a wavelength of 240 nm, 193 nm or some other wavelength). Radiation emitted by the laser may have a spectrum which is spread over for example 0.3 picometers (pm), and in some instances may have a spectrum which is spread over for example 1 to 2 pm. The spectrum may include several peaks.

It is desirable to provide improved control of the spectrum of laser radiation emitted by a laser radiation source, thereby allowing a pattern to be projected more accurately onto a substrate by a lithographic apparatus.

BRIEF SUMMARY OF THE INVENTION

This section summarizes some aspects of the invention and briefly introduces some embodiments of the invention. Simplifications or omissions may be made to avoid obscuring the purpose of the section. Such simplifications or omissions are not intended to limit the scope of the invention.

One embodiment of the invention is a lithographic method. The method includes calculating a laser metric based on a spectrum of laser radiation emitted from a laser to a lithographic apparatus together with a representation of an aerial image of a pattern to be projected onto the substrate by the lithographic apparatus, and using the laser metric to modify operation of the laser or adjust the lithographic apparatus, and projecting the pattern onto the substrate.

A second embodiment of the invention is a lithographic apparatus including a patterning device and a projection system configured to project a pattern from the patterning device onto a substrate. The lithographic apparatus further includes a control module configured to calculate a laser metric based on a spectrum of laser radiation emitted from a laser to the lithographic apparatus, and on a representation of an aerial image of a pattern to be projected onto the substrate, the control module being further configured to use the laser metric to modify operation of the laser or adjust the lithographic apparatus.

A third embodiment of the invention is a laser configured to emit laser radiation which may be used by a lithographic apparatus. The laser is configured to calculate a laser metric based on a spectrum of the laser radiation and on a representation of an aerial image of a pattern to be projected onto the substrate by the lithographic apparatus, the laser being further configured to use the laser metric to modify operation of the laser or to adjust the lithographic apparatus.

Various features and advantages of the invention, as well as the structure and operation of various embodiments of the invention, are described in detail below with reference to the accompanying drawings. The invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated in and constitute part of the specification, illustrate embodiments of the invention and, together with the general description given above and the detailed descriptions of embodiments given below, serve to explain the principles of the invention. In the drawings.

Figure 1:
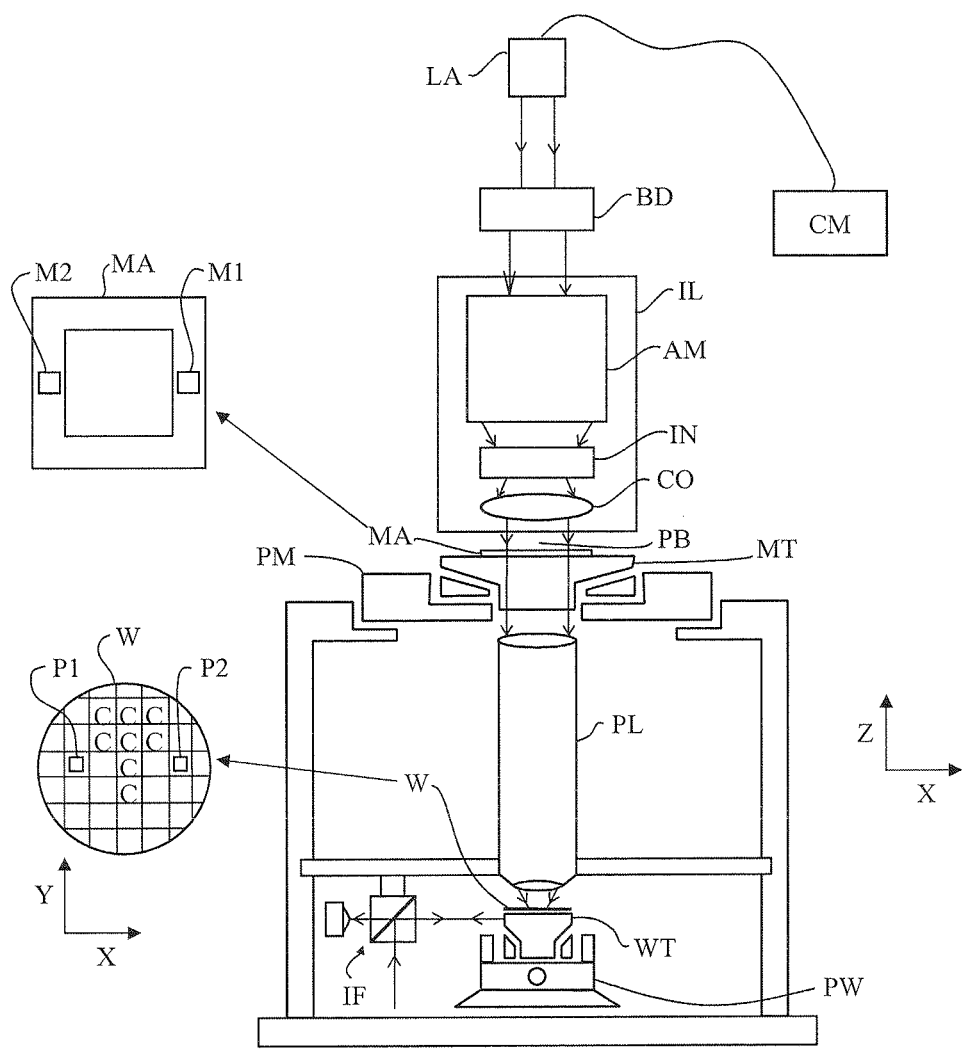
FIG. 1 depicts a lithographic apparatus according to an embodiment of the invention.

Features and advantages of the invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

The invention will be better understood from the following descriptions of various "embodiments" of the invention. Thus, specific "embodiments" are views of the invention, but each does not itself represent the whole invention. In many cases individual elements from one particular embodiment may be substituted for different elements in another embodiment carrying out a similar or corresponding function.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. Those skilled in the arts to which the invention pertains will appreciate that, in the context of such additional applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all suitable types of electromagnetic radiation which may be emitted by a laser, including ultraviolet (UV) radiation (e.g. having a wavelength of 365, 248, 193, 157 or 126 nm). The terms "radiation" and "beam" may also encompass EUV radiation (e.g. having a wavelength of 13.5 nm or 6.7 nm)

The term "patterning device" used herein is intended to be broadly interpreted as referring to a device that can be used to impart a radiation beam with a pattern in its cross-section such as to create a pattern in a target portion of the substrate. The pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a manner which depends on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

- an illumination system (illuminator) IL to condition a beam PB of radiation (e.g. UV radiation).
- a support structure (e.g. a support structure) MT to support a patterning device (e.g. a mask) MA and connected to first positioning device PM to accurately position the patterning device with respect to item PL;
- a substrate table (e.g. a wafer table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source, which in this embodiment is a laser LA. The laser and the lithographic apparatus may be considered to be separate entities. A radiation beam emitted by the laser LA is passed from the laser to the illuminator IL with the aid of a beam delivery system BD comprising for example suitable directing mirrors and/or a beam expander. The laser LA and the illuminator IL, together with the beam delivery system BD if required, may be referred to as a radiation system.

A control module CM which forms part of the lithographic apparatus is connected to the laser LA. The control module CM receives data from the laser LA which represents the spectrum of laser radiation emitted by the laser. The control module calculates laser metrics using this data and data which represents an aerial image of a pattern to be projected onto the substrate. The control module may send required operating parameters to the laser, which may be calculated using the calculated laser metrics. Operation of the laser may be adjusted in order to provide laser radiation with the required operating parameters. The control module CM may also adjust operation of the lithographic apparatus based upon the calculated laser metrics.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As mentioned further above, the control module CM sends required operating parameters to the laser LA. The required operating parameters may for example include the wavelength of the laser beam to be generated by the laser LA. The wavelength which is required by the lithographic apparatus will change over time due to changes of the pressure and temperature inside the lithographic apparatus.

The required operating parameters may also include the bandwidth of the laser beam to be generated by the laser LA. The bandwidth may for example be expressed as a so-called E95 value. The E95 value specifies the bandwidth of the spectrum that contains 95% of the spectral energy of the laser beam.

The E95 value is an example of a laser metric. The term 'laser metric' is intended to refer to a property of the laser beam, or a property which depends upon both the laser beam and an aerial image of a pattern to be projected by the lithographic apparatus (as explained further below). Other required laser metrics may be sent to the laser, as is described further below.

The control module CM receives from the laser LA data which represents the wavelength of the laser beam emitted by the laser, and data which represents the spectrum of the laser beam. The control module CM performs operations on the spectrum in order to obtain laser metrics which may be used to modify operation of the lithographic apparatus, and thereby improve the accuracy with which a pattern is projected onto the substrate W. The laser metrics obtained using the operations may be used to adjust the lithographic apparatus; for example to determine a best-focus position of the substrate table WT in the Z-direction. The laser metrics obtained using the operations may also be used to provide feedback to the laser LA, which causes the laser to modify the spectrum of the laser radiation being emitted. For example, the laser metrics may be used to determine a revised E95 value which may be sent to the laser LA, thereby causing the laser to emit a laser beam with a modified spectrum that provides improved imaging of a pattern onto the substrate.

The invention may allow the lithographic apparatus to control operation of the laser LA such that it generates a laser beam having a spectrum which is better suited to a pattern which is to be projected onto a substrate (compared with the spectrum of the laser beam which would have been emitted without the invention).

In an embodiment, a pattern which is to be projected from the patterning device MA to the substrate W comprises contact holes. The contact holes may be represented on the patterning device MA as a plurality of isolated disks. When projecting the contact holes onto the substrate W 'focus drilling' may be used. Focus drilling comprises forming partial images of the contact holes on the substrate W at different positions relative to a focal plane. Referring to FIG. 1, partial images of the contact holes may be formed on the substrate W for a variety of different positions of the substrate in the z-direction.

When focus drilling is being performed, it may be desirable to use a laser beam which has a spectrum that is broader than that of a conventionally used laser beam. For example, a conventional lithographic apparatus may use a laser beam which has an E95 value of 0.3 picometers (pm). The E95 value may be fixed, such that there is no need for the control module CM to send E95 values to the laser LA. Where this is the case, the wavelength may be the only varying laser spectrum related parameter which is sent from the lithographic apparatus to the laser. However, when focus drilling is being performed, a laser beam having an E95 value which is considerably larger than 0.3 pm may be desirable (e.g. an E95 value of 1 pm or more).

Figure 2:
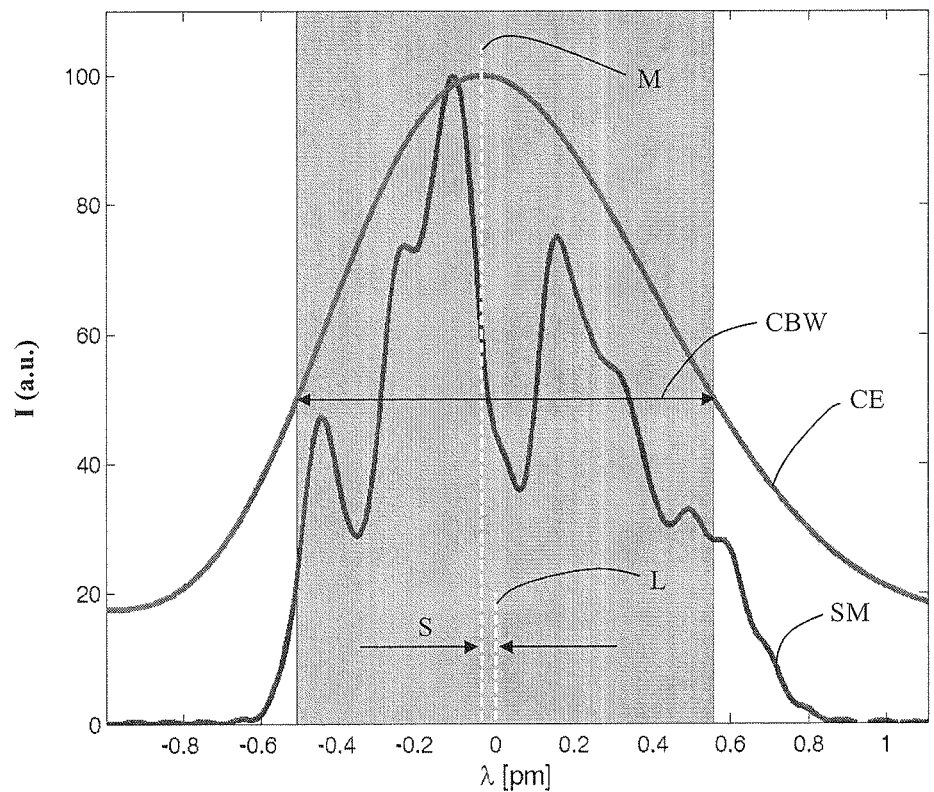
FIG. 2 is a graph which shows the spectrum of a laser beam and the convolution of that spectrum with a representation of an aerial image according to an embodiment of the invention.

FIG. 2 is a graph which shows a spectrum SM of radiation (intensity I as a function of wavelength λ). The spectrum SM is an example of a spectrum which may be emitted by the laser LA, for example when contact holes are being projected onto a substrate W using focus drilling. The spectrum SM is asymmetric, and extends to a wavelength which is approximately 0.6 pm less than a central wavelength (0 pm), and to a wavelength which is approximately 0.8 pm longer than the central wavelength. The E95 value of the spectrum SM is approximately 1.1 pm. The spectrum includes several peaks.

Although the E95 value specifies the bandwidth of the spectrum SM, it does not specify other properties of the spectrum such as the flatness of the spectrum (i.e. absence of peaks) or the asymmetry of the spectrum. Properties such as the flatness and asymmetry of the spectrum may have a significant effect upon the performance of the lithographic apparatus. For example, these properties may have an effect on the critical dimension, best focus, depth of focus and iso-dense bias of features imaged by the lithographic apparatus. The critical dimension is the smallest dimension which can be imaged by the lithographic apparatus. The best focus is at the plane in which the sharpest image will be formed on the substrate W. The depth of focus is the range of positions in the z-direction over which the image will be formed correctly on the substrate W. The iso-dense bias is the difference in dimensions of an image of an isolated feature compared with an image of the same feature in a densely packed environment.

Variation in the flatness or asymmetry of the spectrum of the laser beam may cause variation of imaging metrics of the lithographic apparatus. The imaging metrics include critical dimension, best focus, depth of focus and iso-dense bias of the lithographic apparatus to vary. For example, a significant variation of critical dimension and the best focus may be seen for two laser radiation spectra which have the same E95 value but which have different spectral shapes.

The control module CM determines laser metrics which may be used to adjust the lithographic apparatus and thereby improve the performance of the lithographic apparatus. The control module also uses the laser metrics to modify the required E95 value sent to the laser, and thereby obtain a laser spectrum which allows the performance of the lithographic apparatus to be improved.

The control module CM determines the laser metrics by performing two operations upon the spectrum of radiation emitted by the laser (the spectrum is measured by the laser LA, and a representation of the spectrum is passed from the laser to the control module CM). The first operation is a mathematical calculation of a convolution of the laser spectrum with a representation of an aerial image of a reference object. The second operation is a mathematical calculation of a convolution of the laser spectrum with a representation of an aerial image of a pattern which is to be projected by the lithographic apparatus onto a substrate.

The first operation, the convolution of the spectrum with a representation of an aerial image of a reference object, is used to determine a central reference wavelength of the laser spectrum.

The reference object may for example be a pattern which is used in the lithographic apparatus to determine the best focus of the lithographic apparatus (e.g. a pattern used in conjunction with an image sensor provided on the substrate table WT). The representation of the aerial image of the reference object may for example be a Lorentzian function with an offset (other functions may be used). In one example representation of the reference aerial image, which is expressed as a function of wavelength, may be:

$$f(\lambda) = \frac{c}{1+\left(\frac{\lambda}{d}\right)^2} + e \quad \text{(equation 1)}$$

where c=0.8312, d=0.5354 pm (picometers) and e=0.05288. The control module convolutes the laser spectrum with the representation of the aerial image. Once the convolution has been calculated, the full width half maximum (FWHM) points of the calculated convolved spectrum is determined (in this context the term 'convolved spectrum' is intended to refer to the result of the convolution of the laser spectrum with the aerial image). The midway point between full width half maximum points is calculated for the calculated convolved spectrum, and is taken as being the central reference wavelength of the convolved spectrum. This is also taken as being the central reference wavelength of the laser spectrum itself. Other methods may be used to determine the central reference wavelength of the convolved spectrum, for example determining the wavelength at which the convolved spectrum is at its maximum, or determining the midway point between the full width 40% maximum points. The midway point between full width half maximum points may be used because it has been found to provide good results. In an embodiment, an average central reference wavelength may be determined using a series of convolved spectra.

Once the central reference wavelength of the laser spectrum has been determined, the laser spectrum is shifted such that the origin of the wavelength axis of the spectrum (λ=0) coincides with the central reference wavelength. This shift is applied because the wavelength which the laser LA indicates as being the central wavelength of the laser spectrum may be offset from the central reference wavelength of the laser spectrum. Shifting the central wavelength provides a correction of this offset, thereby providing the laser spectrum with a corrected central wavelength.

The second operation is a mathematical calculation of a convolution of the laser spectrum with a representation of an aerial image of a pattern feature on the patterning device MA which is to be projected onto the substrate W. For example, the patterning device MA may be provided with features which are configured to form contact holes on the substrate W. An example of a representation (expressed as a function of wavelength) which may be used to represent an aerial image of a contact hole is:

$$g(\lambda) = e^{-a*\lambda^2} * (\cos(b*\lambda))^2 \quad \text{(equation 2)}$$

where a=1.280 pm-2 and b=2.521 pm-1. This aerial image representation is convolved with the laser spectrum. The laser spectrum which is used for the convolution has been shifted to provide the corrected central wavelength, as described above. The convolved spectrum which results from convolving the aerial image with the spectrum is shown as a curve CE in FIG. 2.

The central wavelength of the convolved spectrum is calculated. The calculation may look for the wavelength at which the convolved spectrum CE has a maximum value (the calculation may include interpolation between data points). This wavelength, which is taken as being the central wavelength of the convolved spectrum CE, is shown in FIG. 2 by dotted line M.

In an alternative approach, the calculation of the central wavelength of the convolved spectrum CE may comprise performing a Riemann sum (or other integration operation) of the portion of the convolved spectrum which is above a threshold, and locating a mid-point (with respect to wavelength) of the area obtained using the Riemann sum (or other integration operation).

Figure 3:
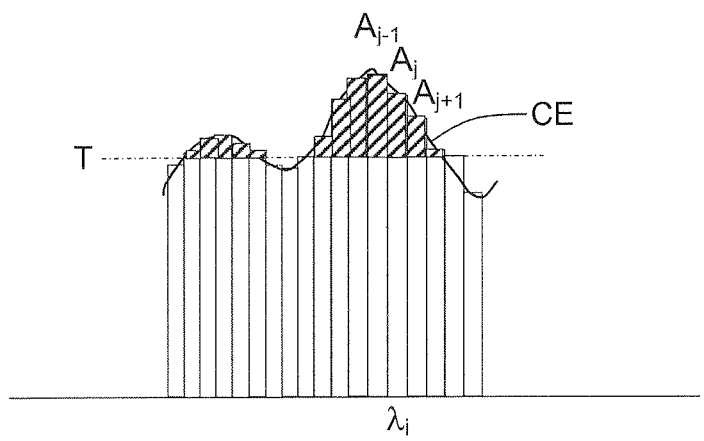
FIG. 3 is a graph which shows the convolution of a different spectrum of a laser beam with an aerial image according to an embodiment of the invention.

FIG. 3 schematically represents part of a convolved spectrum CE which includes two peaks. A threshold T has been applied to the convolved spectrum CE. In this example the threshold T is applied at 90% of the maximum intensity of the convolved spectrum. The threshold T could however be applied at other percentages of the maximum intensity. The area between the convolved spectrum CE and the threshold T is calculated using the Riemann sum (or other integration operation) as a function of wavelength, and a mid-point of the area is determined. The mid-point may be considered to be the 'centre of gravity' of the area. The calculation of the midpoint of the area as a function of wavelength may be expressed as:

$$\lambda_{central} = \frac{\sum_j A_j \lambda_j}{\sum_j A_j} \quad \text{(equation 3)}$$

where $A_j$ is the area above the threshold for a given wavelength $\lambda_j$. The interval $\Delta\lambda_j$ between successive wavelength values is an arbitrary interval, and may for example be ≤10 fm. An advantage of using this approach to determine the central wavelength of the convolved spectrum CE rather than looking at the maximum value of the convolved spectrum (as described further above) is that it provides better results if the convolved spectrum includes two peaks or includes a shoulder.

Other criteria may be used to determine the central wavelength of the convolved spectrum CE, for example determining the midway point between the full width half maximum points, or the full width 40% maximum points.

The central wavelength of the convolved spectrum is compared with the corrected central wavelength of the laser spectrum (e.g. as indicated by dotted line L in FIG. 2) as determined using the first convolution as described above. The difference between these central wavelengths is calculated in order to determine a wavelength shift (indicated by arrows S). This wavelength shift is referred to hereafter as the convolved spectral shift (CSS). The convolved spectral shift, which is expressed in pm in FIG. 2, is a laser metric.

The convolved spectral shift is a metric which provides an indication of the difference between the best focus of the lithographic apparatus when imaging the reference object and the best focus of the lithographic apparatus when imaging the contact hole. If the spectrum were symmetric, then the difference would be zero. However, in practice the spectrum is not symmetric, and so there is a non-zero difference.

The convolved spectral shift enables determination of the plane of best focus for imaging the contact hole, relative to the best focus position of the reference object. This allows the substrate table WT to be moved from a best focus z-position for imaging the reference object (determined using a measured aerial image of the reference object) to the best focus z-position for imaging the contact hole (the required movement of the substrate table WT being determined using the calculated convolved spectral shift). Thus the position of the substrate table WT in the z-direction may be corrected accordingly.

The best focus z-position for imaging the reference object is measured using the reference object in conjunction with an imaging detector provided on the substrate table WT. The reference object may be a pattern provided on the patterning device MA or on the support structure MT of the patterning device. The imaging detector provided in the substrate table WT is used to detect the aerial image of the reference object convolved with the laser spectrum (i.e. the aerial image generated when the reference object is illuminated by the laser). The substrate table WT is moved through a range of positions in the z-direction, with the imaging detector recording the image at each position. The best focus z-position for imaging the reference object is determined using the distribution in the z-direction of the detected convolved image.

A relationship between the convolved spectral shift and the best focus difference (i.e. the difference between the best focus of the lithographic apparatus when imaging the reference object and the best focus of the lithographic apparatus when imaging the contact hole) may be determined in advance for the lithographic apparatus. The relationship may for example be a linear relationship, a substantially linear relationship, or some other relationship. Since the convolved spectral shift and the best focus position for imaging the reference object are known, the relationship between the convolved spectral shift and the best focus difference may be used to correct the position of the substrate table WT in the z-direction.

The relationship between the convolved spectral shift and the best focus difference may for example be determined through calibration measurements. The calibration measurements may for example comprise determining the convolved spectral shift for a given lithographic apparatus and pattern (e.g. a contact hole), and exposing one or more wafers with contact hole patterns with different offsets in the z-direction from the best focus position (the best focus position being measured using the reference object as described above).

Alternatively, the relationship between the convolved spectral shift and the best focus difference may be determined using a simulation of imaging of the pattern (e.g. contact hole) by the lithographic apparatus.

The process described above may be repeated per substrate, per substrate lot, or periodically according to some other time interval.

In an alternative arrangement, the position of the patterning device MA is adjusted in the z-direction rather than the position of the substrate table WT. In a further alternative arrangement, the positions of both the patterning device MA and the substrate table WT are adjusted in the z-direction.

The convolved spectral shift will vary over time. It may therefore be determined periodically, and periodically used to correct the position of the substrate table WT in the z-direction accordingly.

It may be desirable to keep the convolved spectral shift within a predetermined range of values. The predetermined range of values may be restricted such that correction of the position of the substrate table WT in the z-direction (relative to the best focus as measured using the reference object) is not necessary. For example, it may be desirable to keep the convolved spectral shift close to zero, which in practice means that the laser spectrum is symmetrical or is substantially symmetrical. In an embodiment, this may be achieved by instructing the laser LA to keep the convolved spectral shift within a predetermined range of values. For example, in the 32 nm node, when imaging contact holes of 80 nm diameter with inter-hole distances ranging from 120 to 350 nm, it may be desirable to keep the absolute value of the convolved spectral shift smaller than around 30 fm (e.g. averaged over a period such as 60 seconds). The same or a similar absolute value of the convolved spectral shift may be desirable when imaging contact holes in the 28 nm node. It may be desirable to keep the absolute value of the convolved spectral shift smaller than around 60 fm when imaging contact holes in the 45 nm node (e.g. averaged over a period such as 60 seconds).

The laser LA may for example be provided with this instruction by the lithographic apparatus during operation of the lithographic apparatus. Alternatively, the laser may be configured such that its operational specification ensures that the convolved spectral shift is kept within the required range (e.g. the laser is set up such that the convolved spectral shift remains within the required range). Measurement of the convolved spectral shift may be performed by the lithographic apparatus and/or by the laser.

An advantage arising from keeping the convolved spectral shift close to zero is that, because the laser spectrum is symmetrical or is substantially symmetrical, the depth of focus provided by the laser spectrum is retained. If the convolved spectral shift were to be too large, then any depth of focus advantage provided by high bandwidth laser radiation could be lost due to asymmetry of the laser spectrum. Keeping the convolved spectral shift close to zero avoids this disadvantage.

An additional advantage arising from keeping the convolved spectral shift close to zero is that it avoids the need to provide a feedback loop to correct the position of the substrate table WT in the z-direction (as described further above), thereby simplifying operation of the lithographic apparatus.

The full width half maximum of the convolved spectrum CE may be determined in addition to or instead of the convolved spectral shift. This is referred to hereafter as the convolved bandwidth, and is shown in FIG. 2 by double headed arrow CBW. The convolved bandwidth, which is expressed in pm in FIG. 2, is a laser metric.

It has been determined using experimentation that the convolved bandwidth has a significantly stronger correlation with the critical dimension of a lithographic apparatus than the E95 value. Thus, controlling the convolved bandwidth will provide a better critical dimension performance of the lithographic apparatus than merely controlling the E95 value.

Although the above described calculation of the convolved bandwidth includes a shift of the spectrum such that the origin of the wavelength axis of the spectrum ($\lambda=0$) coincides with the central reference wavelength, this shift is not required when calculating the convolved bandwidth. The convolved bandwidth may be calculated by convolving the aerial image of the feature to be projected with the spectrum as received from the laser, without applying a wavelength correction to the spectrum.

If it is the case that the only parameters which are sent to the laser LA are the wavelength and the E95 value, then the control module CM cannot send a request to the laser to provide a spectrum with a particular convolved bandwidth. Instead, the control module CM uses the E95 value to control the spectrum of the laser beam in order to obtain a desired convolved bandwidth (or to adjust the spectrum so that it has a convolved bandwidth which is closer to a desired convolved bandwidth). A relationship exists between the E95 values and the convolved bandwidth, such that if the E95 value is adjusted then a scaling of the convolved bandwidth occurs (to a first order approximation). Therefore, it is possible to calculate the change of convolved bandwidth which may be expected when a modified E95 value is requested. Thus, if the convolved bandwidth of the laser radiation differs from a desired value, a modified requested E95 value may be sent to the laser LA which is expected to provide a convolved bandwidth which differs less from the desired value. This process may be repeated iteratively, bringing the convolved bandwidth closer to the desired value.

The relationship which exists between the E95 value and convolved bandwidth, is different for different lasers, and will also change over time. This is because the convolved bandwidth changes as the shape of the spectrum of laser radiation emitted by the laser changes. For this reason, a fixed relationship between E95 and the convolved bandwidth cannot be determined. This is why an iterative process may be used to adjust the convolved bandwidth via the E95 values.

Although the above description uses the example of a contact hole pattern, embodiments of the invention may be applied for any suitable pattern.

In an alternative embodiment of the invention, the control module CM does not attempt to use E95 values to control the convolved bandwidth of the laser beam emitted by the laser LA, but instead sends a requested convolved bandwidth to the laser. The laser then generates a laser beam having the requested convolved bandwidth. As explained above, the calculation of the convolved bandwidth of the laser beam requires a convolution with the aerial image of the pattern to be projected by the lithographic apparatus. For this reason, the laser LA requires information from the lithographic apparatus regarding the pattern to be projected. The control module CM may send to the laser LA data representing the aerial image of the pattern to be projected. Alternatively, these data may be provided to the laser manufacturer and the software used by the laser modified accordingly to calculate a requested convolved bandwidth.

The laser LA may calculate the convolved bandwidth of the laser beam that it is emitting in the manner described above. If this convolved bandwidth does not correspond with the requested convolved bandwidth, then operation of the laser is adjusted in order to bring the convolved bandwidth closer to the requested convolved bandwidth. Monitoring of the convolved bandwidth and adjustment of the operation the laser may be performed continuously by the laser, or may be performed periodically by the laser.

In an alternative embodiment of the invention, the control module CM sends a requested convolved bandwidth to the laser. The control module CM then monitors the convolved bandwidth during operation of the lithographic apparatus, and sends the convolved bandwidth to the laser LA. If the monitored convolved bandwidth does not correspond with the requested convolved bandwidth, operation of the laser is adjusted in order to bring the convolved bandwidth closer to the requested convolved bandwidth.

In an embodiment, the convolved bandwidth and the convolved spectral shift may be used in combination during operation of the lithographic apparatus. Using the convolved bandwidth and the convolved spectral shift together may allow better focus drilling to be achieved than if either the convolved bandwidth or the convolved spectral shift were to be used in isolation. In an embodiment, the control module CM may send a requested convolved bandwidth and a requested convolved spectral shift to the laser LA.

Other laser metrics may be used in combination with the convolved bandwidth and the convolved spectral shift. Laser metrics based on the convolved bandwidth or the convolved spectral shift may be used.

Figure 4:
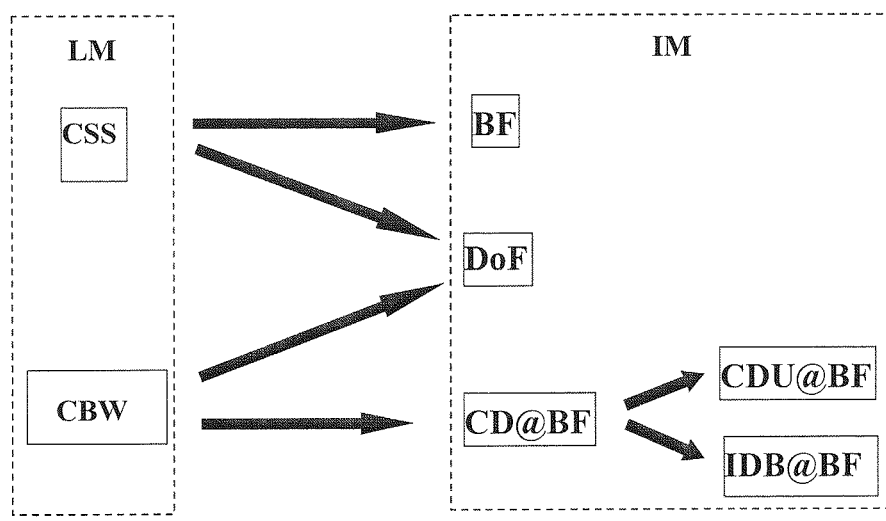
FIG. 4 is a correlation diagram which shows schematically how metrics of a laser affect properties of the lithographic apparatus of FIG. 1.

FIG. 4 is a schematic correlation diagram which shows the convolved spectral shift CSS and the convolved bandwidth CBW, both of which are examples of laser metrics LM. FIG. 4 also shows imaging metrics IM of the lithographic apparatus, namely the best focus BF, depth of focus DoF, critical dimension at best focus CD@BF, critical dimension uniformity at best focus CDU@BF, and iso-dense bias at best focus IDB@BF of the lithographic apparatus. Relationships between the laser metrics LM and the imaging metrics IM are shown as arrows. As is shown in FIG. 4, the best focus BF is mainly related to the convolved spectral shift CSS. Critical dimension at best focus CD@BF, critical dimension uniformity at best focus CDU@BF, and iso-dense bias at best focus IDB@BF are all mainly related to the convolved bandwidth CBW. The depth of focus DoF is related to both the convolved spectral shift CSS and to the convolved bandwidth CBW.

It may be desirable to keep the imaging metrics of the lithographic apparatus within predetermined ranges. Using the relationship between the imaging metrics and the laser metrics, values of the laser metrics may be calculated which keep the imaging metrics within the predetermined ranges.

The laser metrics may be determined per substrate, per substrate lot (e.g. 13 substrates, 25 substrates, or some other number of substrates), or per other time interval. The laser metrics may be determined during projection of a pattern onto a substrate. Adjustment of the laser and/or the lithographic apparatus using the laser metrics may be performed during projection of a pattern onto a substrate.

Above described embodiments of the invention use particular laser metrics, namely the convolved spectral shift and the convolved bandwidth. However, the invention may use other laser metrics in addition to, or as an alternative to, one or more of those laser metrics. For example, another laser metric may be determined which expresses the asymmetry of the spectrum. This may for example be calculated by determining the slope of either side of the convolved spectrum CE and adding the slopes together. The slopes may for example be determined at the full width 40% maximum of the convolved spectrum (or at some other point on the convolved spectrum). The selection of laser metrics to be used by an embodiment of the invention may depend upon the size and/or shape of the pattern which is to be imaged by the lithographic apparatus.

Although the description refers to the use of a convolution to determine laser metrics which are based upon the spectrum of laser radiation and an aerial image, other mathematical processes may be used.

An alternative laser metric which may be used is E95 squared (or the root mean square (RMS) of E95). The critical dimension uniformity (variation of contrast) of a lithographic apparatus may scale with the variation of E95 squared. Similarly, the variation of critical dimension between different lithographic apparatus may also scale with the variation of E95 squared. Thus, using the E95 squared laser metric may provide improved pattern imaging (compared with the conventional prior art use of E95). The scaling of critical dimension with E95 squared arises from the quadratic form of the Bossung curve of lithographic apparatus, combined with linear dependency of laser wavelength to focus.

Data determined using the invention may be represented in tabular form, i.e. a set of wavelengths and associated values. Alternatively, data determined using the invention may be represented in parametric form, i.e. as a function with associated parameters. Representing the data in parametric form may provide greater accuracy than representing the data in tabular form.

Above described embodiments of the invention use a representation of an aerial image of a contact hole when calculating laser metrics, because the lithographic apparatus is imaging contact holes onto the substrate W. If the lithographic apparatus is imaging some other pattern onto the substrate, then a representation of an aerial image of that pattern is used when calculating the laser metrics. Taking into account the pattern which is being imaged when calculating the laser metrics provides an improved performance of the lithographic apparatus. In this context, the term 'pattern' is not intended to be limited to the entire pattern which is provided on the patterning device MA, but instead may be interpreted for example as meaning a feature or group of features provided on the patterning device.

The aerial image which is used during calculation of the laser metrics may be a functional approximation. The term 'aerial image' is intended to encompass any suitable representation of an aerial image.

Embodiments of the invention may be used in conjunction with focus drilling using a lithographic apparatus. Embodiments of the invention may provide improved determination of the best focus when focus drilling is being performed, thereby reducing the likelihood that the lithographic apparatus strays outside of a desired range of focus values.

Embodiments of the invention allow improved matching between different lithographic apparatus when focus drilling is being performed. In this context, the term 'improved matching' is intended to mean that patterns formed on substrates using the same pattern device MA in two different lithographic apparatus are more similar to each other than would be the case if the invention were not used. The improved matching may be independent of the type of laser LA which is being used. The improved matching may reduce the need to manually monitor the performance of the laser LA, and thereby lower the maintenance and monitoring costs of focus drilling using lithographic apparatus.

Embodiments of the invention determine a laser metric which is based on the spectrum of the laser radiation and an aerial image of a feature to be projected from the patterning device to the substrate. The laser metric may be used to correct one or more properties of the lithographic apparatus, and/or to modify the spectrum of the laser radiation such that it provides improved operation of the lithographic apparatus.

The invention may be further described using the following clauses:

1. A lithographic apparatus comprising:
a patterning device;
a projection system configured to project a pattern from the patterning device onto a substrate;
a control module configured to calculate a laser metric based on a spectrum of laser radiation emitted from a laser to the lithographic apparatus, and on a representation of an aerial image of a pattern to be projected onto the substrate, the control module being further configured to use the laser metric to modify operation of the laser or adjust the lithographic apparatus.

2. The apparatus of clause 1, wherein the control module is configured to calculate the laser metric by convolving the spectrum with the representation of the aerial image of the pattern to be projected onto the substrate, and then obtaining a measurement of the width of the resulting convolved spectrum, wherein the width of the convolved spectrum is measured as the full width half maximum of the convolved spectrum.

3. The apparatus of clause 1, wherein the control module is configured to calculate the laser metric by determining a central reference wavelength of the spectrum via convolution of the spectrum with a representation of an aerial image of a reference object, determining a second central wavelength of the spectrum via convolution of the spectrum with the representation of the aerial image of the pattern to be projected onto the substrate, and calculating the difference between the central reference wavelength and the second central wavelength.

4. The apparatus of clause 3, wherein the control module is configured to use a relationship between the best focus of the lithographic apparatus and the calculated difference between the central reference wavelength and the second central wavelength to determine a best focus of the lithographic apparatus for projecting the pattern onto the substrate.

5. The apparatus of clause 3, wherein the reference object is a pattern which is imaged onto a sensor by a projection system of the lithographic apparatus.

6. The apparatus of clause 1, wherein the laser metric is at least partially dependent upon the asymmetry of the spectrum of laser radiation.

7. The apparatus of clause 1, wherein modifying the operation of the laser causes the spectrum of the laser radiation to be modified.

8. The apparatus of clause 1, wherein the control module is configured to calculate an additional laser metric and send the additional laser metric to the laser.

9. The apparatus of clause 8, wherein the additional laser metric is E95, E95 squared, or the root mean square of E95.

CONCLUSION

It is to be appreciated that the Detailed Description section, and not the Summary and Abstract sections, is intended to be used to interpret the claims. The Summary and Abstract sections are abbreviated and may describe one or more but not all exemplary embodiments of the invention as contemplated by the inventor(s), and thus, are not intended to limit the invention and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the specification is to be interpreted by the skilled artisan in light of the teachings and guidance.

Various embodiments of the invention have been described above. It should be understood that they have been presented by way of example only, and not limitation. It will be apparent to persons skilled in the relevant art that various changes in form and detail can be made from those specifically described without departing from the spirit and scope of the invention. Thus, the breadth and scope of the invention should not be limited by any of the above-described exemplary embodiments, but should be defined only in accordance with the following claims and their equivalents.

What is claimed is:

1. A lithographic method, comprising:
calculating a laser metric based on convolving a spectrum of laser radiation emitted from a laser together with a representation of an image of a pattern to be projected onto a substrate within a lithographic apparatus;
using the laser metric to modify operation of the laser or adjust the lithographic apparatus; and
projecting the pattern onto the substrate.

2. The method of claim 1, wherein the calculating of the laser metric further comprises: obtaining a measurement of a width of a resulting convolved spectrum.

3. The method of claim 2, wherein the width of the convolved spectrum is measured as a full width half maximum of the resulting convolved spectrum.

4. The method of claim 1, wherein the calculating of the laser metric further comprises:
determining a central reference wavelength of the spectrum via convolution of the spectrum with a representation of an image of a reference object,
determining a second central wavelength of a resulting convolved spectrum between the spectrum and the representation of the image of the pattern to be projected onto the substrate, and
calculating the difference between the central reference wavelength and the second central wavelength.

5. The method of claim 4, further comprising determining a best focus of the lithographic apparatus for projecting the pattern onto the substrate using the calculated difference between the central reference wavelength and the second central wavelength.

6. The method of claim 4, wherein the second central wavelength is determined by applying a threshold to the convolution of the spectrum with the representation of the image of the pattern to be projected onto the substrate, performing an integration operation to determine the area between the convolution and the threshold, and determining a midpoint of the area as a function of wavelength.

7. The method of claim 4, wherein the laser is instructed to maintain the difference between the central reference wavelength and the second central wavelength within a predetermined range of values.

8. The method of claim 4, wherein the reference object is a pattern which is imaged onto a sensor by a projection system of the lithographic apparatus.

9. The method of claim 1, wherein the laser metric is at least partially dependent upon the asymmetry of the spectrum of laser radiation.

10. The method of claim 1, wherein modifying the operation of the laser modifies the spectrum of the laser radiation.

11. The method of claim 1, wherein the laser metric is calculated by a control module.

12. The method of claim 1, wherein the laser metric is calculated by the lithographic apparatus.

13. The method of claim 12, wherein the lithographic apparatus calculates an additional laser metric and sends the additional laser metric to the laser.

14. The method of claim 13, wherein the additional laser metric is E95, E95 squared, or the root mean square of E95.

15. A lithographic apparatus comprising:
a patterning device;
a projection system configured to project a pattern from the patterning device onto a substrate; and
a control module configured to calculate a laser metric based on convolving a spectrum of laser radiation emitted from a laser with a representation of an image of a pattern to be projected onto the substrate, the control module being further configured to use the laser metric to modify operation of the laser or adjust the lithographic apparatus.

16. The apparatus of claim 15, wherein the control module is further configured to obtain a measurement of a width of the resulting convolved spectrum.

17. The apparatus of claim 15, wherein the control module is further configured to:
- calculate the laser metric by determining a central reference wavelength of the spectrum via convolution of the spectrum with a representation of an image of a reference object,
- determine a second central wavelength of a resulting convolved spectrum between the spectrum and the representation of the image of the pattern to be projected onto the substrate, and
- calculate the difference between the central reference wavelength and the second central wavelength.

18. The apparatus of claim 17, wherein the control module is further configured to determine a best focus of the lithographic apparatus for projecting the pattern onto the substrate by using the calculated difference between the central reference wavelength and the second central wavelength.

19. A system, comprising:
- a laser configured to emit laser radiation for being used by a lithographic apparatus; and
- a control module configured to calculate a laser metric based on convolving a spectrum of the laser radiation with a representation of an image of a pattern to be projected onto a substrate within the lithographic apparatus and to use the laser metric to modify operation of the laser or to adjust the lithographic apparatus.

* * * * *